United States Patent
Tan et al.

(10) Patent No.: US 6,381,841 B1
(45) Date of Patent: May 7, 2002

(54) MECHANISM FOR LOADING A RESPECTIVE FUZZ BUTTON INTO EACH OF A HIGH NUMBER OF BUTTON HOLES WITHIN AN IC CONTACTOR

(75) Inventors: Seok Hiong Tan; Siew May Fong; Chew Hsia Fung, all of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 122 days.

(21) Appl. No.: 09/649,860

(22) Filed: Aug. 28, 2000

Related U.S. Application Data

(62) Division of application No. 09/333,428, filed on Jun. 15, 1999, now Pat. No. 6,192,576.

(51) Int. Cl.[7] .............................................. H01R 43/00
(52) U.S. Cl. .............................. 29/884; 29/876; 29/874; 29/837; 29/832; 29/593
(58) Field of Search ........................ 29/884, 834, 833, 29/837, 832, 740, 747, 739, 759, 714, 593, 876, 874; 439/66, 68, 70, 67, 69, 525

(56) References Cited

U.S. PATENT DOCUMENTS

| | | | | |
|---|---|---|---|---|
| 4,395,184 A | * | 7/1983 | Braden | 414/417 |
| 4,459,743 A | * | 7/1984 | Watanabe et al. | 29/740 |
| 4,586,251 A | * | 5/1986 | Kimoshita et al. | 29/741 |
| 4,637,134 A | * | 1/1987 | Tomita | 29/741 |
| 4,995,157 A | * | 2/1991 | Hall | 29/740 |
| 5,218,753 A | * | 6/1993 | Suzuki et al. | 29/740 |
| 5,337,465 A | * | 8/1994 | Tamaki et al. | 29/740 |
| 5,828,310 A | * | 10/1998 | Foo et al. | 340/674 |

FOREIGN PATENT DOCUMENTS

| | | | | |
|---|---|---|---|---|
| GB | 2076709 A | * | 5/1981 | 29/741 |
| JP | 60189291 | * | 9/1985 | 29/741 |

* cited by examiner

*Primary Examiner*—Peter Vo
*Assistant Examiner*—Sean Smith
(74) *Attorney, Agent, or Firm*—Monica H. Choi

(57) ABSTRACT

The present invention is a method and apparatus for efficiently placing a respective fuzz button into each of a high number of button holes on a fuzz button contactor while also efficiently filtering out defectively shaped fuzz buttons. The fuzz buttons are placed into rows of a predetermined number of button holes on the fuzz button contactor. A slot plate has the predetermined number of slots aligned as a row of slots, and fuzz buttons are placed into each of the slots of the slot plate. The present invention also includes a contactor jig having at least one row of the predetermined number of jig holes. These jig holes are disposed on the contactor jig as a mirror image of the at least one row of the predetermined number of button holes on the fuzz button contactor when the contactor jig is properly aligned with the fuzz button contactor. The slots of the slot plate are aligned with a row of jig holes, and the slot plate is tilted such that a respective fuzz button slides from a respective slot of the slot plate into each empty jig hole of the row of jig holes. The transfer of a respective fuzz button from a respective slot of the slot plate into each empty jig hole of a row of jig holes is repeated for each of the rows of the predetermined number of jig holes on the contactor jig. The contactor jig having completely filled jig holes is properly aligned with the fuzz button contactor having empty button holes. A dummy integrated circuit package is pushed into the contactor jig after the fuzz button contactor has been properly aligned with the contactor jig. The dummy integrated circuit package has a respective pin that pushes out a respective fuzz button within each jig hole on the contactor jig into a respective button hole on the fuzz button contactor such that a respective fuzz button is placed into each of the button holes on the fuzz button contactor.

8 Claims, 7 Drawing Sheets

MECHANISM FOR LOADING A RESPECTIVE FUZZ BUTTON INTO EACH OF A HIGH NUMBER OF BUTTON HOLES WITHIN AN IC CONTACTOR

This is a divisional of an earlier filed copending patent application with Ser. No. 09/333,428 filed on Jun. 15, 1999, for which priority is claimed now U.S. Pat. No. 6,192,576. This earlier filed copending patent application with Ser. No. 09/333,428 is in its entirety incorporated herewith by reference.

TECHNICAL FIELD

This invention relates to components used in testing systems for integrated circuit packages, and more particularly to a mechanism for efficiently loading a respective fuzz button into each of a high number of button holes within an IC contactor used for testing of integrated circuit packages.

BACKGROUND OF THE INVENTION

In a testing system for testing a relatively large integrated circuit, such as a modem microprocessor for example, an integrated circuit contactor (also named a fuzz button contactor) has a respective fuzz button loaded into each of 321 button holes. Each fuzz button is a conductive granule that provides a conductive path from an integrated circuit package testing system to a respective one of 321 pins from the integrated circuit package for holding the relatively large integrated circuit.

Referring to FIG. 1, a top view of an example fuzz button contactor 102 shows a plurality of button holes. An example button hole 104 holds an example fuzz button 106. A fuzz button contactor has at least one row of a predetermined number of button holes. A fuzz button contactor used for testing the integrated circuit package for a modem microprocessor has a total of 321 button holes for example. However, for clarity of illustration, the fuzz button contactor 102 of FIG. 1 has eight rows of five button holes including a first row 108 (shown by a dashed line in FIG. 1), a second row 110 (shown by a dashed line in FIG. 1), a third row 112 (shown by a dashed line in FIG. 1), a fourth row 114 (shown by a dashed line in FIG. 1), a fifth row 116 (shown by a dashed line in FIG. 1), a sixth row 118 (shown by a dashed line in FIG. 1), a seventh row 120 (shown by a dashed line in FIG. 1), and an eighth row 122 (shown by a dashed line in FIG. 1).

In the prior art, a respective fuzz button is manually placed into each of the button holes of the fuzz button contactor 102. A human operator examines a fuzz button visually to determine that the fuzz button is not defectively shaped such that the fuzz button would fit into a button hole. Then, the human operator manually places the fuzz button into an empty button hole on the fuzz button contactor 102. However, such manual inspection and placement of a respective fuzz button into each of the button holes of the fuzz button contactor 102 requires much time and labor, especially when the fuzz button contactor is used for testing a relatively large integrated circuit package such as a fuzz button contactor having 321 button holes.

Thus, a mechanism is desired for more efficiently filtering out defectively shaped fuzz buttons and for more efficiently placing a respective fuzz button into each of a high number of button holes on the fuzz button contactor.

SUMMARY OF THE INVENTION

Accordingly, the present invention is a method and apparatus for efficiently placing a respective fuzz button into each of a high number of button holes on the fuzz button contactor while also efficiently filtering out defectively shaped fuzz buttons.

Generally, the present invention is a method and apparatus for loading a respective fuzz button into each button hole of at least one row of a predetermined number of button holes within a fuzz button contactor. The present invention includes a slot plate having the predetermined number of slots aligned as a row of slots, and fuzz buttons are placed into each of the slots of the slot plate. The present invention also includes a contactor jig having at least one row of the predetermined number of jig holes. These jig holes are disposed on the contactor jig as a mirror image of the at least one row of the predetermined number of button holes on the fuzz button contactor when the contactor jig is properly aligned with the fuzz button contactor.

A respective fuzz button from a respective slot of the slot plate is transferred into each empty jig hole of a row of jig holes of the contactor jig by aligning the row of slots with the row of jig holes such that each slot is aligned with a respective jig hole. The slot plate is then tilted such that a respective fuzz button slides from a respective slot of the slot plate into each empty jig hole of the row of jig holes. The transfer of a respective fuzz button from a respective slot of the slot plate into each empty jig hole of a row of jig holes is repeated for each of the at least one row of the predetermined number of jig holes on the contactor jig.

The present invention further includes alignment units disposed on the contactor jig and on the fuzz button contactor for properly aligning the contactor jig with the fuzz button contactor such that each jig hole on the contact jig faces a respective button hole on the fuzz button contactor.

In addition, the present invention includes a dummy integrated circuit package that is pushed into the contactor jig after the fuzz button contactor has been properly aligned with the contactor jig. The dummy integrated circuit package has a respective pin that pushes out a respective fuzz button within each jig hole on the contactor jig into a respective button hole on the fuzz button contactor when the dummy integrated circuit package is pushed into the contactor jig.

With the present invention, a defectively shaped fuzz button is trapped within a slot of the slot plate such that the defectively shaped fuzz button does not slide into any jig hole of the contactor jig. Thus, the present invention efficiently filters out any defectively shaped fuzz button from being placed into a button hole of the fuzz button contactor.

The present invention may be used to particular advantage for efficiently loading a respective fuzz button into each of a high number of button holes on a fuzz button contactor used for testing a relatively large integrated circuit package. For example, a modem microprocessor integrated circuit package may have 321 pins which corresponds to a respective fuzz button placed into each of 321 button holes on the fuzz button contactor.

These and other features and advantages of the present invention will be better understood by considering the following detailed description of the invention which is presented with the attached drawings.

BRIEF DESCRIPTION OF THE DRAWINGS

FIG. 12, including

The figures referred to herein are drawn for clarity of illustration and are not necessarily drawn to scale. Moreover, the figures referred to herein show an example of a fuzz button contactor having a relatively low number of button holes for clarity of illustration. Elements having the same reference number in FIGS. 1, 2, 3, 4, 5, 6A, 6B, 7, 8, 9, 10A, 10B, 11, 12A, 12B, and 13 refer to elements having similar structure and function.

DEATAILED DESCRIPTION

Figure 1:
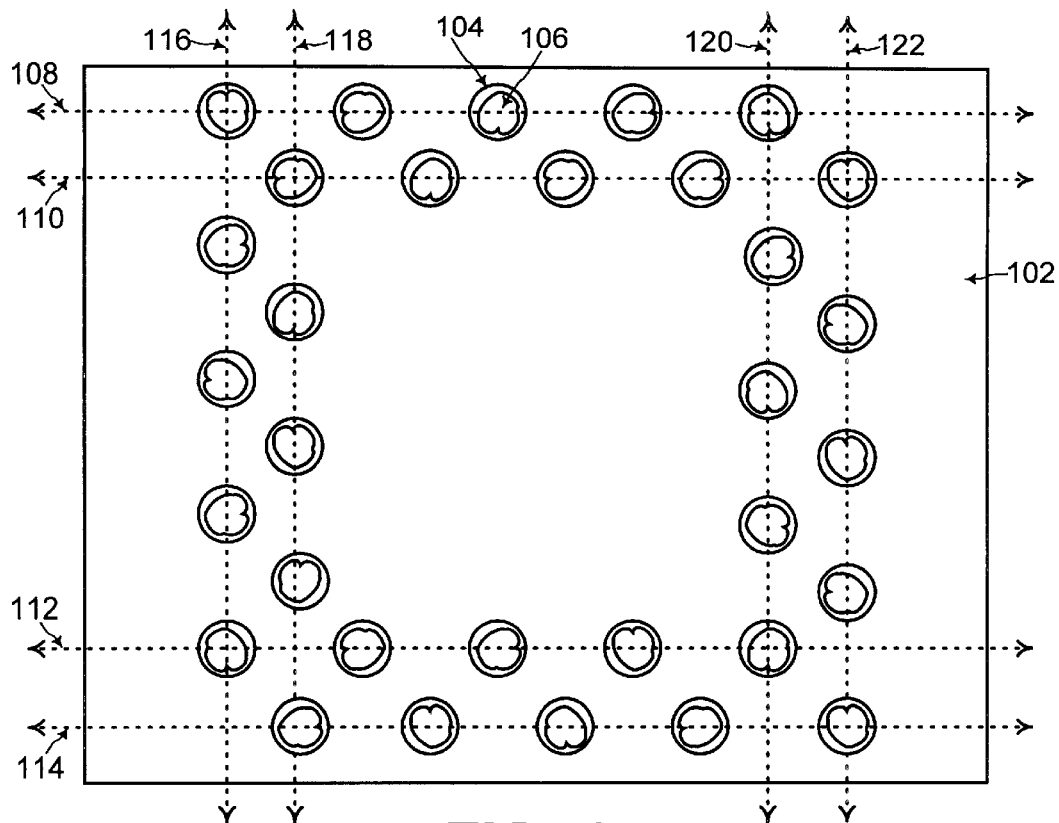
FIG. 1 shows a top view of an example fuzz button contactor with a respective fuzz button placed into a plurality of rows of a predetermined number of button holes.
Figure 2:
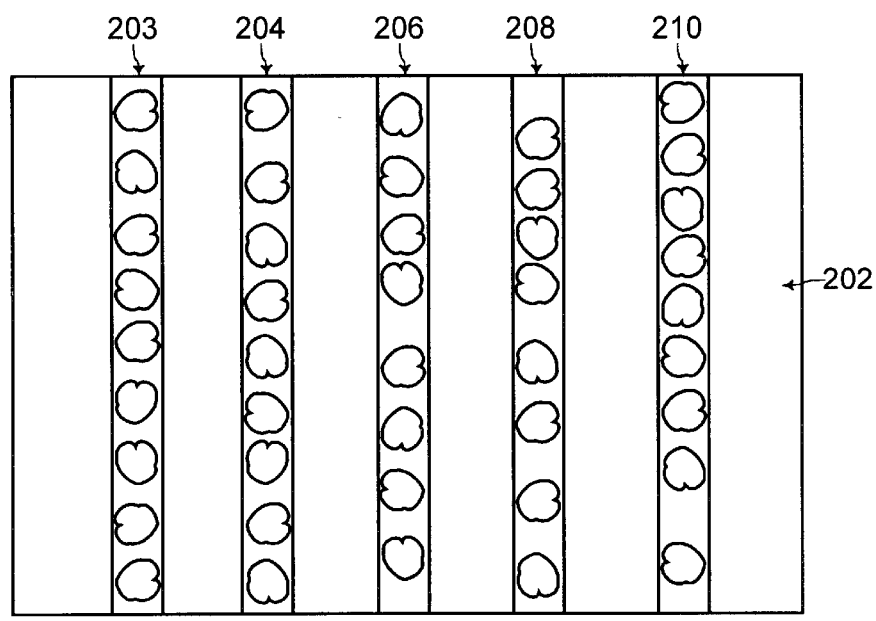
FIG. 2 shows a slot plate having the predetermined number of slots for holding fuzz buttons, according to an embodiment of the present invention.

Referring to FIG. 2, the present invention includes a slot plate 202 having the predetermined number of slots aligned as a row of slots. Referring to FIGS. 1 and 2, the predetermined number of slots corresponds to the predetermined number of button holes of any row of button holes on the fuzz button contactor 102. Thus, slot plate 202 corresponding to the fuzz button contactor of FIG. 1 includes a first slot 203, a second slot 204, a third slot 206, a fourth slot 208, and a fifth slot 210.

Figure 3:
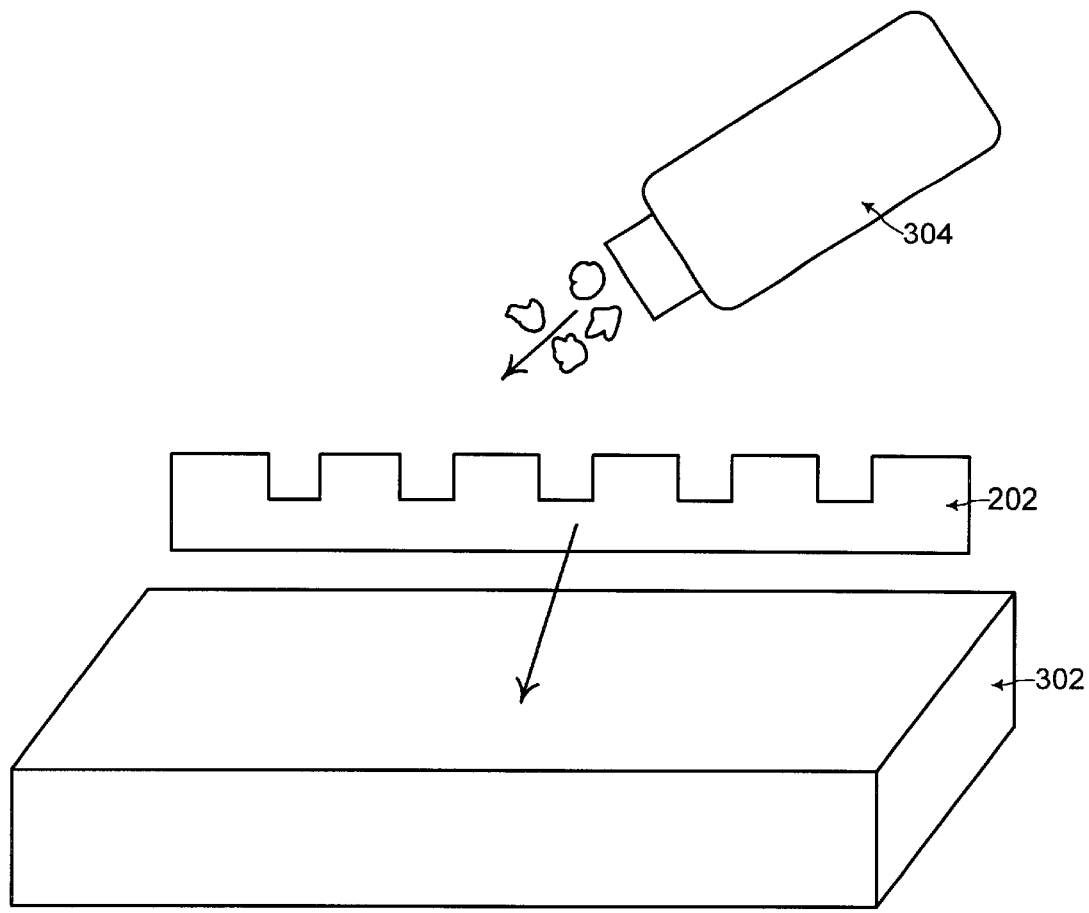
FIG. 3 shows components of the present invention for loading the slot plate of FIG. 2 with fuzz buttons acceding to an embodiment of the present invention.
Figure 4:
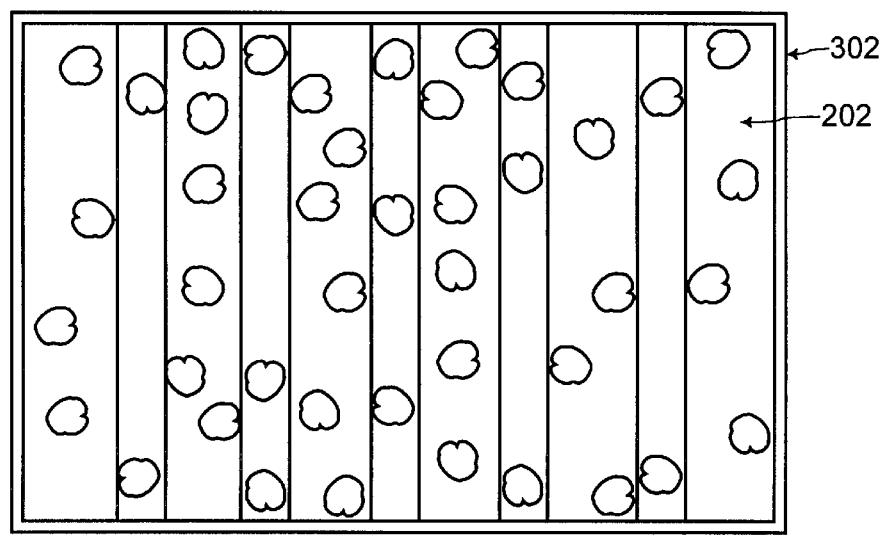
FIG. 4 shows a top of the slot plate when fuzz buttons are initially poured onto the slot plate and before container holding the slot plate is shaken.
Figure 5:
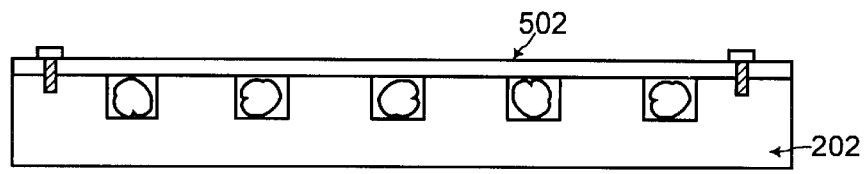
FIG. 5 shows a cross sectional view of the slot plate after fuzz buttons are loaded into each slot of the slot plate and after a cover is placed over the slot plate, according to an embodiment of the present invention.

According to the present invention, fuzz buttons are placed into each slot of the slot plate 202. Referring to FIG. 3, before fuzz buttons are placed into the slots of the slot plate 202, the slot plate 202 is placed into a container 302. Once the slot plate 202 is placed into the container 302, fuzz buttons are poured from a bottle of fuzz buttons 304 onto the slot plate 202 within the container 302. Referring to FIG. 4, fuzz buttons are initially distributed randomly over the slot plate 202. To place the fuzz buttons within the slots of the slot plate 202, the container 302 of FIG. 4 is shaken until the fuzz buttons slip into the slots of the slot plate 202 as shown in FIG. 2. Referring to FIG. 5, once the fuzz buttons slip into the slots of the slot plate 202, a cover 502 is screwed onto the face of the slot plate 202 and over the row of slots of the slot plate 202 to retain the fuzz buttons within the row of slots when the slot plate 202 is tilted.

Figure 6A:
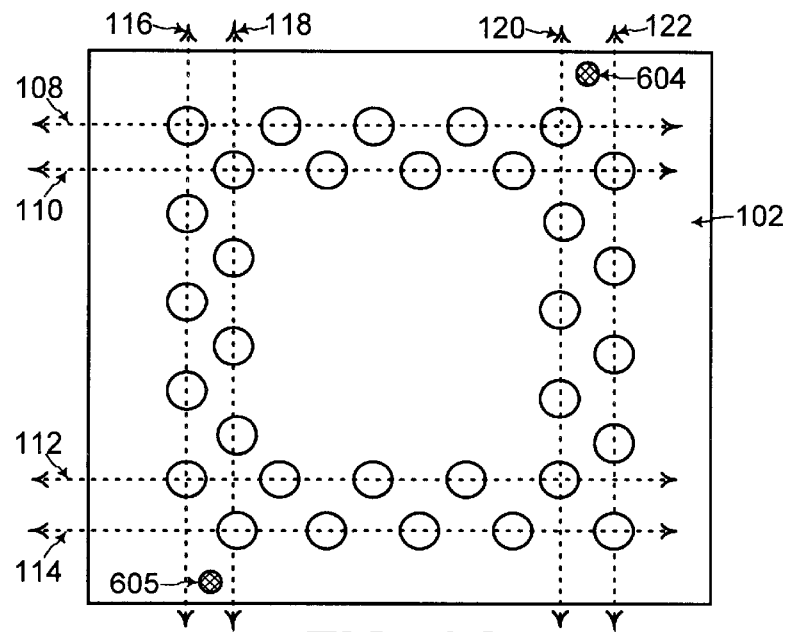
FIG. 6A shows a top view of the fuzz button contactor of FIG. 1 with the button holes being empty, according to an embodiment of the present invention.
Figure 6B:
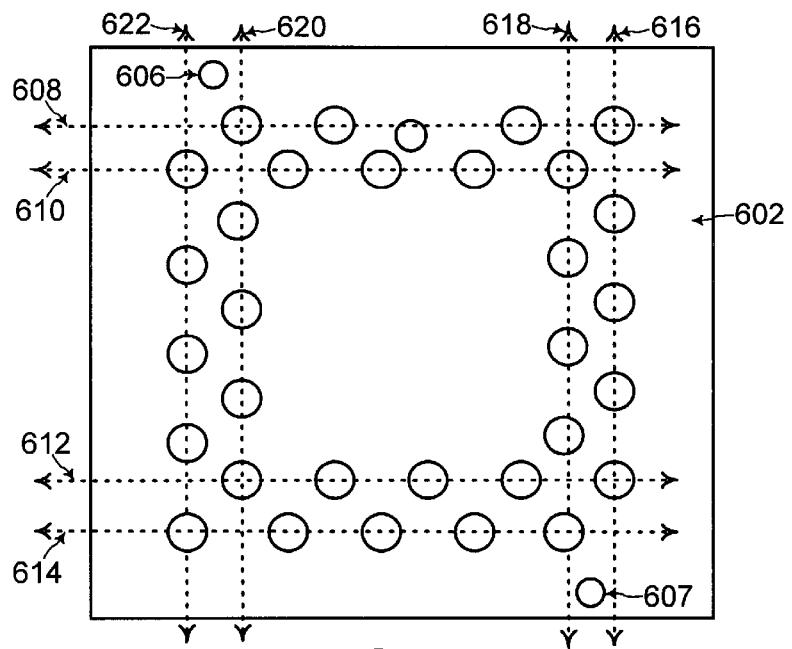
FIG. 6B shows a top view of a contactor jig that corresponds to the fuzz button contactor of FIG. 6A and with jig holes that are initially empty, according to an embodiment of the present invention.

Referring to FIG. 6A, the fuzz button contactor 102 of FIG. 1 has the row of button holes that are initially empty. Referring to FIG. 6B, a contactor jig 602 corresponds to the fuzz button contactor 102 of FIG. 6A. The contactor jig 602 has rows of the predetermined number of jig holes that are disposed on the contactor jig 602 as a mirror image of the rows of the predetermined number of buttons holes on the fuzz button contactor 102 when the contactor jig 602 is properly aligned with the fuzz button contactor 102.

Referring to FIGS. 6A and 6B, alignment units are used for properly aligning the contactor jig 602 with the fuzz button contactor 102. The alignment units of the present invention include a first dowel guide pin 604 and a second dowel guide pin 605 disposed on the fuzz button contactor 102 as shown in FIG. 6A. The alignment units of the present invention also include a first guide hole 606 and a second guide hole 607 disposed on the contactor jig 602 as shown in FIG. 6B.

For properly aligning the contactor jig 602 with the fuzz button contactor 102, the first dowel guide pin 604 on the fuzz button contactor 102 is placed into the first guide hole 606 on the contactor jig 602, and the second dowel guide pin 605 on the fuzz button contactor 102 is placed into the second guide hole 607 on the contactor jig 602. With such an alignment, the contactor jig 602 has a first row of jig holes 608 that aligns with the first row of button holes 108, a second row of jig holes 610 that aligns with the second row of button holes 110, a third row of jig holes 612 that aligns with the third row of button holes 112, a fourth row of jig holes 614 that aligns with the fourth row of button holes 114, a fifth row of jig holes 616 that aligns with the fifth row of button holes 116, a sixth row of jig holes 618 that aligns with the sixth row of button holes 118, a seventh row of jig holes 620 that aligns with the seventh row of button holes 120, and an eighth row of jig holes 622 that aligns with the eighth row of button holes 122.

Figure 7:
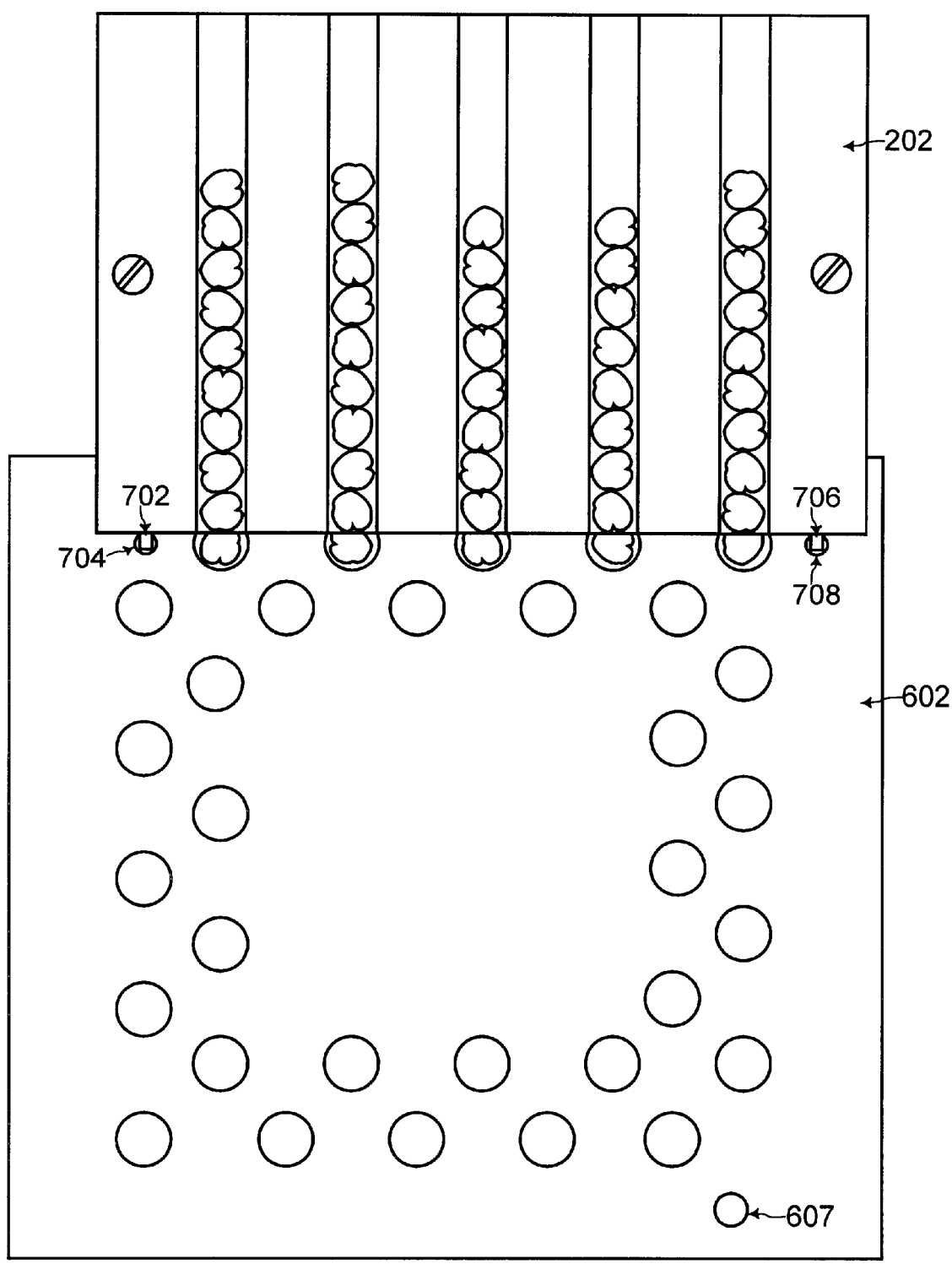
FIG. 7 illustrates placement of a respective fuzz button from a respective slot of the slot plate into each empty jig hole of a row of jig holes within the contactor jig of FIG. 6B, according to an embodiment of the present invention.

For loading a respective fuzz button into each of the button holes of the fuzz button contactor 102, fuzz buttons are first placed into the jig holes of the contactor jig 602, according to the present invention. Referring to FIGS. 5 and 7, the slots of the slot plate 202, with fuzz buttons loaded into the slots of the slot plate, are aligned with a row of the jig holes of the contactor jig 602. In FIG. 7, a respective slot of the slot plate 202 is aligned with each of the five jig holes of the first row 608 of jig holes. For such alignment, a first alignment pin 702 on the slot plate 202 is inserted into a first alignment hole 704 disposed to the left of the first row 608 of jig holes, and a second alignment pin 706 on the slot plate 202 is inserted into a second alignment hole 708 disposed to the right of the first row 608 of jig holes.

With such alignment, each slot of the slot plate 202 is aligned with a respective jig hole of the first row 608 of the jig holes. The slot plate 202 is then tilted such that a respective fuzz button slides from a respective slot into each empty jig hole of the first row 608 of the jig holes. Referring to FIG. 5, the cover 502 is preferably clear plastic or glass such that the fuzz buttons within the slots of the slot plate 202 may be visible when the cover 502 is placed over the slots of the slot plate 202. The slot plate 202 is preferably tilted at an angle of approximately 90° with respect to the plane of the contactor jig 602.

Figure 8:
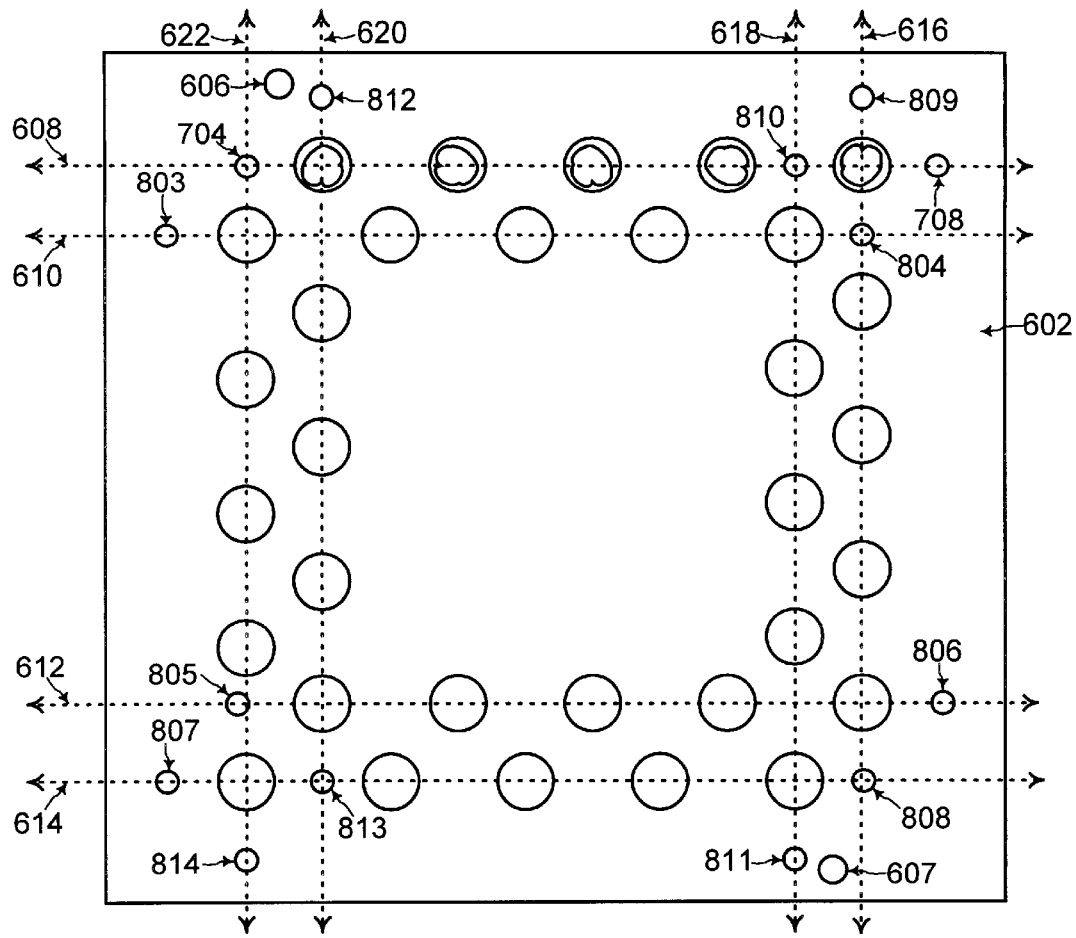
FIG. 8 shows alignment holes on the contactor jig of FIG. 6B used for aligning the slot plate to each row of jig holes, according to an embodiment of the present invention.

Such alignment and tilting of the slot plate 202 is repeated for each of the rows of jig holes on the contactor jig 602. Referring to FIG. 8, the first alignment pin 702 on the slot plate 202 is inserted into a third alignment hole 803 disposed to the left of the second row 610 of jig holes, and the second alignment pin 706 on the slot plate 202 is inserted into a fourth alignment hole 804 disposed to the right of the first row 608 of jig holes. With such alignment, a respective fuzz button from a respective slot of the slot plate 202 is then transferred into each empty jig hole of the second row 610 of jig holes.

Similarly, the first alignment pin 702 on the slot plate 202 is inserted into a fifth alignment hole 805 disposed to the left of the third row 612 of jig. holes, and the second alignment pin 706 on the slot plate 202 is inserted into a sixth alignment hole 806 disposed to the right of the third row 612 of jig holes. With such alignment, a respective fuzz button from a respective slot of the slot plate 202 is then transferred into each empty jig hole of the third row 612 of jig holes. The first alignment pin 702 on the slot plate 202 is inserted into a seventh alignment hole 807 disposed to the left of the fourth row 614 of jig holes, and the second alignment pin 706 on the slot plate 202 is inserted into an eighth alignment hole 808 disposed to the right of the fourth row 614 of jig holes. With such alignment, a respective fuzz button from a respective slot of the slot plate 202 is then transferred into each empty jig hole of the fourth row 614 of jig holes.

Additionally, the first alignment pin 702 on the slot plate 202 is inserted into a ninth alignment hole 809 disposed to the top of the fifth row 616 of jig holes, and the second alignment pin 706 on the slot plate 202 is inserted into the eighth alignment hole 808 disposed to the bottom of the fifth row 616 of jig holes. With such alignment, a respective fuzz button from a respective slot of the slot plate 202 is then transferred into each empty jig hole of the fifth row 616 of jig holes. The first alignment pin 702 on the slot plate 202 is inserted into a tenth alignment hole 810 disposed to the top of the sixth row 618 of jig holes, and the second alignment pin 706 on the slot plate 202 is inserted into an eleventh alignment hole 811 disposed to the bottom of the sixth row 618 of jig holes. With such alignment, a respective fuzz button from a respective slot of the slot plate 202 is then transferred into each empty jig hole of the sixth row 618 of jig holes.

Furthermore, the first alignment pin 702 on the slot plate 202 is inserted into a twelfth alignment hole 812 disposed to the top of the seventh row 620 of jig holes, and the second alignment pin 706 on the slot plate 202 is inserted into the thirteenth alignment hole 813 disposed to the bottom of the seventh row 620 of jig holes. With such alignment, a respective fuzz button from a respective slot of the slot plate 202 is then transferred into each empty jig hole of the seventh row 620 of jig holes. The first alignment pin 702 on the slot plate 202 is inserted into the first alignment hole 704 disposed to the top of the eighth row 622 of jig holes, and the second alignment pin 706 on the slot plate 202 is inserted into a fourteenth alignment hole 814 disposed to the bottom of the eighth row 622 of jig holes. With such alignment, a respective fuzz button from a respective slot of the slot plate 202 is then transferred into each empty jig hole of the eighth row 622 of jig holes.

Figure 9:
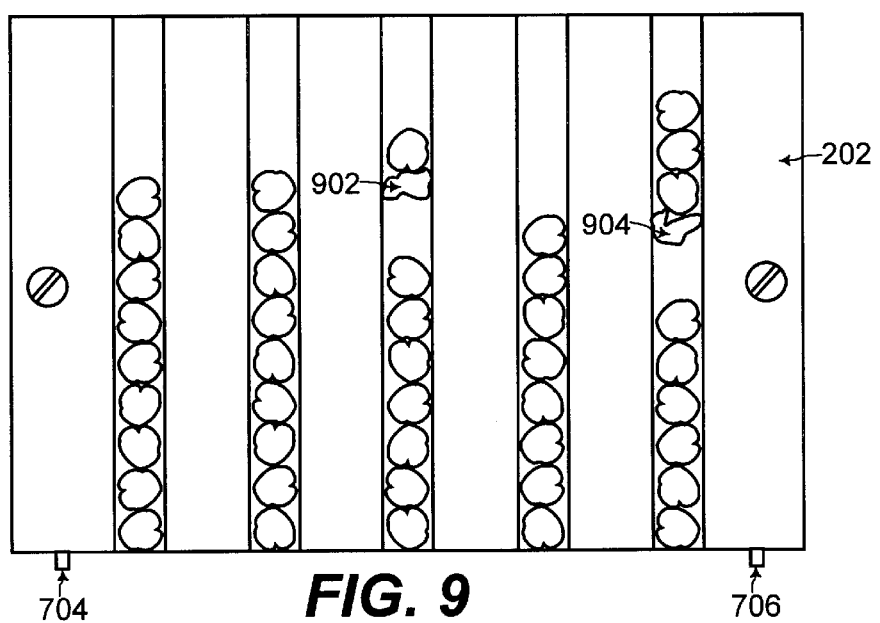
FIG. 9 illustrates the filtering of defectively shaped fuzz buttons within the slot plate, according to an embodiment of the present invention.

In this manner, a respective fuzz button is loaded into each of the jig holes of the contactor jig 602. Referring to FIG. 9, during transfer of fuzz buttons from the slots of the slot plate 202 into the jig holes of the contactor jig 602, any defectively shaped fuzz button is efficiently filtered by the slot plate 202. Referring to FIG. 9, each of a first defectively shaped fuzz button 902 and a second defectively shaped fuzz button 904 becomes trapped within a respective slot of the slot plate 202 when the slot plate 202 is tilted such that a defectively shaped fuzz button does not slide into any jig hole of the contactor jig 602.

Figure 10A:
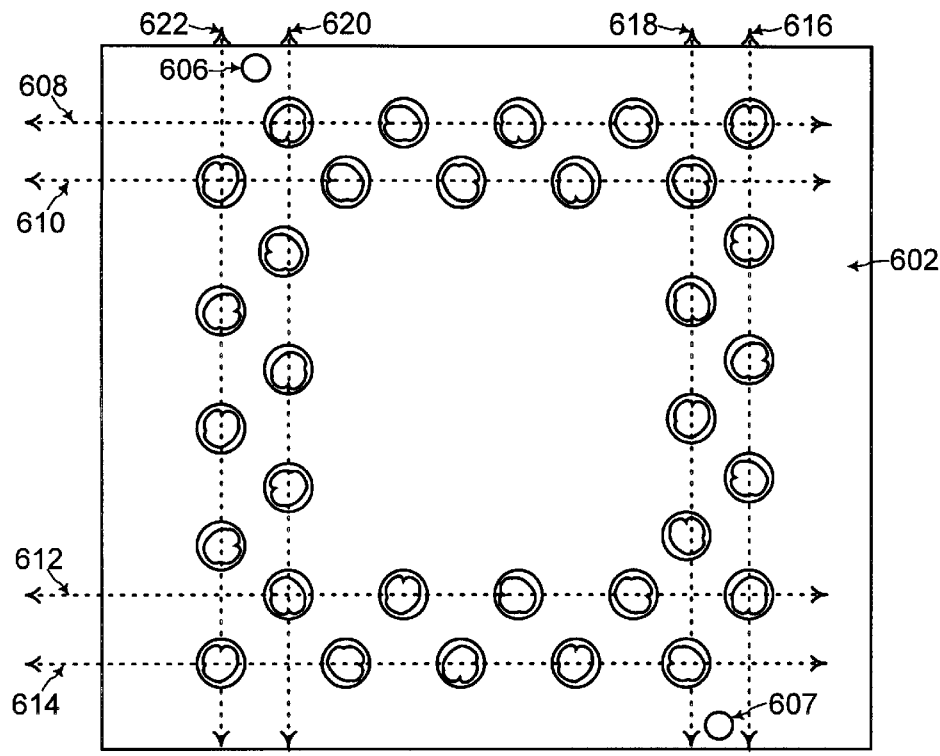
FIG. 10A shows an filled contactor jig that has a respective fuzz button placed into each of the jig holes, according to an embodiment of the present invention.
Figure 10B:
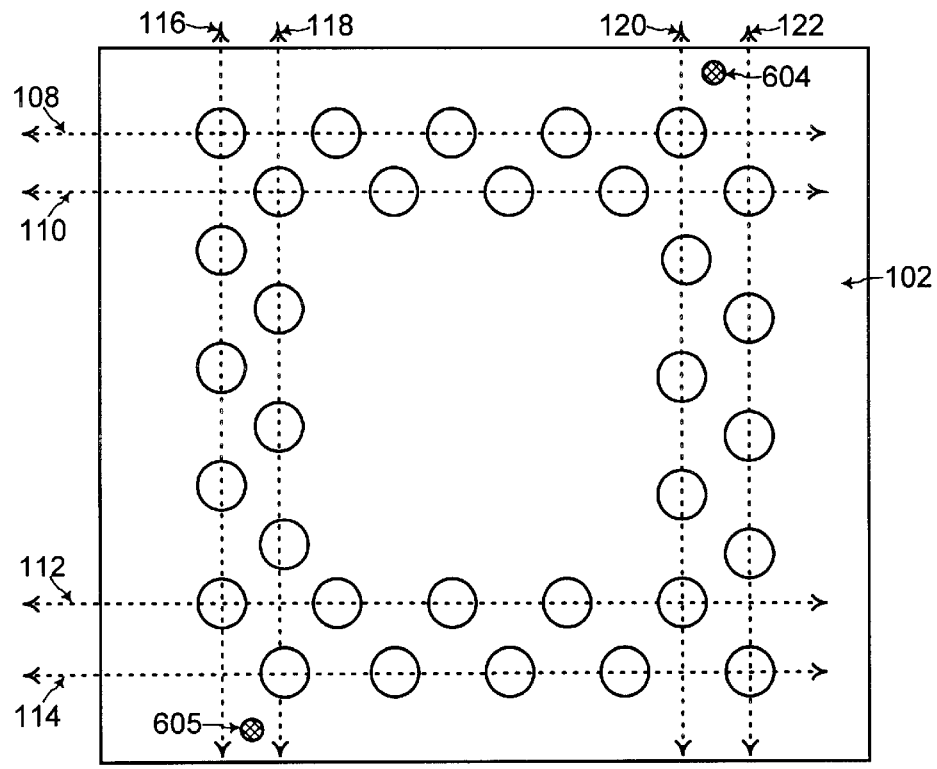
FIG. 10B shows an empty fuzz button contactor without any fuzz buttons placed into each of the button holes, according to an embodiment of the present invention.
Figure 11:
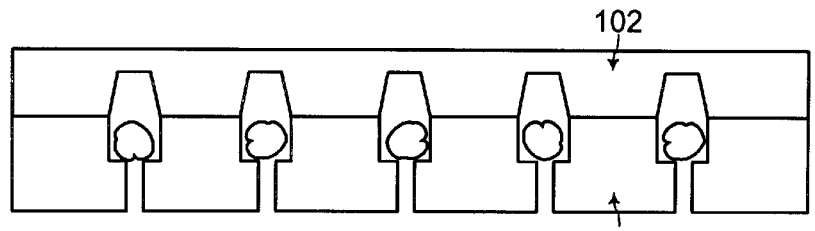
FIG. 11 illustrates, with a cross sectional view, alignment of the contactor jig of FIG. 10A with the fuzz button contactor of FIG. 10B using alignment units, according to an embodiment of the present invention.

Referring to FIGS. 10A and 10B, a respective fuzz button is placed into each of the jig holes of the contactor jig 602, and each button hole of the fuzz button contactor 102 is empty. The contactor jig 602 is then properly aligned with the fuzz button contactor 102 such that each jig hole of the contactor jig 602 faces a respective fuzz button of the fuzz button contactor 102. Referring to FIGS. 10A, 10B, and 11, for properly aligning the contactor jig 602 with the fuzz button contactor 102, the first dowel guide pin 604 on the fuzz button contactor 102 is placed into the first guide hole 606 on the contactor jig 602, and the second dowel guide pin 605 on the fuzz button contactor 102 is placed into the second guide hole 607 on the contactor jig 602.

Figure 12A:
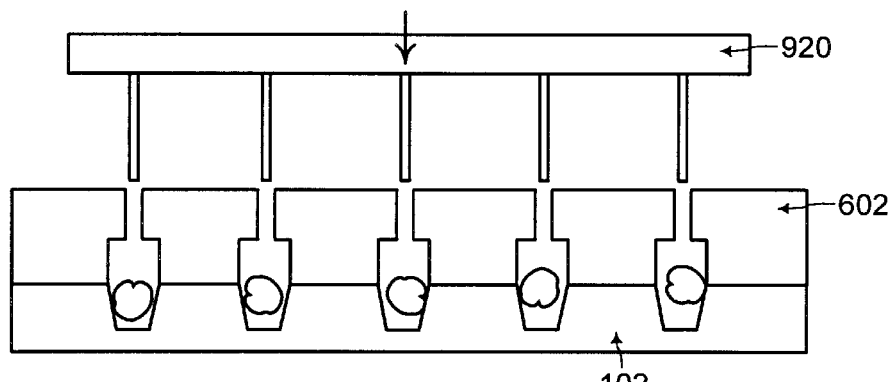
FIGS. 12A and 12B, illustrates use of a dummy integrated circuit package inserted into the jig holes of the jig contactor for transferring fuzz buttons from the contactor jig of Fig. 10A to the fuzz button contactor of Fig. 10B, according to an embodiment of the present invention.
Figure 12B:
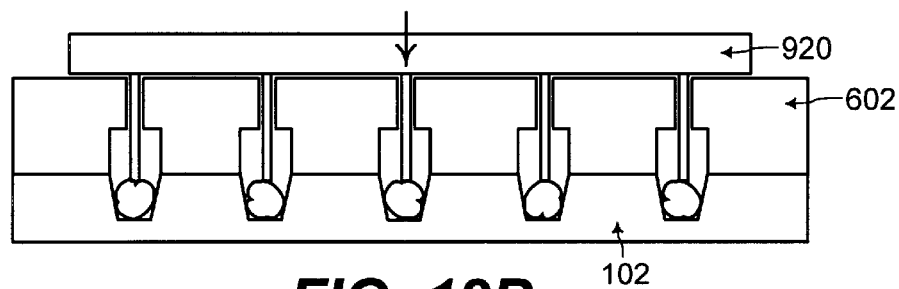

Referring to FIG. 11, a cross-sectional view of the contactor jig 602 and the fuzz button contactor 102 after proper alignment is shown for one row of properly aligned jig holes and button holes. The empty fuzz button contactor 102 is placed on top of the filled contactor jig 602 with proper alignment. Referring to FIG. 12A, after the empty fuzz button contactor 102 is placed onto the filled contactor jig 602 with proper alignment, the joined fuzz button contactor 102 and the contactor jig 602 are flipped over. In addition, a dummy integrated circuit package 920 is pushed into the contactor jig 602. Referring to FIG. 12B, the dummy integrated circuit package 920 has a respective pin that pushes out a respective fuzz button within each jig hole on the contactor jig 602 into a respective button hole on the fuzz button contactor 102.

Figure 13:
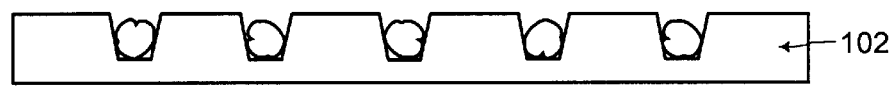
FIG. 13 shows the fuzz button contactor of FIG. 12B that has a respective fuzz button placed into each of the button holes after removal of the contactor jig of FIG. 12B from the fuzz button contactor.

Referring to FIG. 13, once the fuzz buttons have been transferred from the jig holes of the contactor jig 602 to the button holes of the fuzz button contactor 102, the dummy integrated circuit package 920 and the contactor jig 602 are removed from the fuzz button contactor 102. As a result, the fuzz button contactor 102 is left with a respective fuzz button placed into each of the button holes of the fuzz button contactor 102, as shown in FIG. 1.

In this manner, a slot plate is used to place fuzz buttons into rows of jig holes within a contactor jig. The jig holes within a contactor jig are loaded with the fuzz buttons from the slot plate a row at a time. Then, all of the fuzz buttons within the jig holes of the contactor jig are transferred to the button holes of the fuzz button contactor all at once.

Such a handling of fuzz buttons is more efficient than the manual placement of fuzz buttons into the button holes of a fuzz button contactor one fuzz button at a time. In addition, the slot plate efficiently filters out any defectively shaped fuzz button from being placed into any jig hole of the contactor jig. Such a filtering mechanism is more efficient than the visual inspection of each fuzz button. With such an efficient mechanism for placing fuzz buttons into button holes of a fuzz button contactor, a respective fuzz button may be placed into each of a large number of button holes on a fuzz button contactor. For example, the present invention may be used to particular advantage for placing fuzz buttons into button holes of a fuzz button contactor used for testing a relatively large integrated circuit package such as for a modem microprocessor integrated circuit. In that case, the integrated circuit package having the modem microprocessor has 321 pins which corresponds to a respective fuzz button placed into each of 321 button holes on the fuzz button contactor.

The foregoing is by way of example only and is not intended to be limiting. For example, the present invention has been described for an example fuzz button contactor having a relatively small number of button holes for clarity of illustration. However, the present invention may be used for a larger number of button holes on a fuzz button contactor having a larger number of rows of a larger number of button holes, as would be apparent to one of ordinary skill in the art from the description herein. In addition, the configuration of the alignment holes on the outside of the rows of jig holes as illustrated in FIG. 8 are by way of example only. Any configuration of the alignments holes that is amenable for aligning the slots of the slot plate 202 with the jig holes of a row of jig holes on a contactor jig 602 may be used with the present invention, as would be apparent to one of ordinary skill in the art from the description herein. Furthermore, the use of the dowel guide pins 604 and 605 on the fuzz button contactor 102 and the guide holes 606 and 607 on the contactor jig 602 are by way of example only. Any other mechanism for properly aligning the fuzz button contactor 102 with the contactor jig 602 may be used with the present invention, as would be apparent to one of ordinary skill in the art from the description herein.

The invention is limited only as defined in the following claims and equivalents thereof.

We claim:

1. A method for loading a respective fuzz button into each button hole of at least one row of a predetermined number of button holes within a fuzz button contactor, the method including the steps of:

A. placing fuzz buttons into each slot within a slot plate, said slot plate having said predetermined number of slots aligned as a row of slots;

B. transferring a respective fuzz button from a respective slot of said slot plate into each empty jig hole of a row of jig holes of a contactor jig,
wherein said contactor jig has at least one row of said predetermined number of jig holes that are disposed on said contactor jig as a mirror image of said at least one row of said predetermined number of button holes on said fuzz button contactor when said contactor jig is properly aligned with said fuzz button contactor;

C. repeating said step B for each of said at least one row of said predetermined number of jig holes on said contactor jig;

D. properly aligning said contactor jig with said fuzz button contactor such that each jig hole on said contact jig faces a respective button hole on said fuzz button contactor; and E. pushing a dummy integrated circuit package into said contactor jig after said step D, said dummy integrated circuit package having a respective pin that pushes out a respective fuzz button within each jig hole on said contactor jig into a respective button hole on said fuzz button contactor.

2. The method of claim 1, wherein said step A further includes the steps of:
placing said slot plate into a container;
pouring fuzz buttons onto said slot plate within said container; and
shaking said container such that said fuzz buttons slip into each slot of said slot plate.

3. The method of claim 1, wherein said step B further includes the steps of:
placing a cover over said row of slots of said slot plate to retain said fuzz buttons within said row of slots when said slot plate is tilted;
aligning said row of slots with said row of jig holes of said contactor jig such that each slot is aligned with a respective jig hole; and
tilting said slot plate such that a respective fuzz button slides from a respective slot of the slot plate into each empty jig hole of said row of jig holes.

4. The method of claim 3, wherein said slot plate is tilted at an angle of approximately 90 degrees with respect to a plane of said contactor jig, such that a respective fuzz button slides into each empty jig hole of said row of jig holes.

5. The method of claim 1, wherein said step D further includes the step of:
placing a first dowel guide pin disposed on the fuzz button contactor into a first guide hole disposed on the contactor jig, and placing a second dowel guide pin disposed on the fuzz button contactor into a second guide hole disposed on the contactor jig.

6. The method of claim 1, wherein a defectively shaped fuzz button is trapped within a slot of the slot plate such that said defectively shaped fuzz button does not slide into any jig hole of said contactor jig.

7. The method of claim 1, wherein said fuzz button contactor is used for testing an integrated circuit package with 321 pins that correspond to 321 fuzz buttons placed into 321 button holes on said fuzz button contactor.

8. A method for loading a respective fuzz button into each button hole of at least one row of a predetermined number of button holes within a fuzz button contactor, the method including the steps of:

A. placing fuzz buttons into each slot within a slot plate, said slot plate having said predetermined number of slots aligned as a row of slots, said step A further including the steps of:
placing said slot plate into a container;
pouring fuzz buttons onto said slot plate within said container; and
shaking said container such that said fuzz buttons slip into each slot of said slot plate;

B. transferring a respective fuzz button from a respective slot of said slot plate into each empty jig hole of a row of jig holes of a contactor jig,
wherein said contactor jig has at least one row of said predetermined number of jig holes that are disposed on said contactor jig as a mirror image of said at least one row of said predetermined number of button holes on said fuzz button contactor when said contactor jig is properly aligned with said fuzz button contactor;
and wherein said step B further includes the steps of:
placing a cover over said row of slots of said slot plate to retain said fuzz buttons within said row of slots when said slot plate is tilted;

aligning said row of slots with said row of jig holes of said contactor jig such that each slot is aligned with a respective jig hole; and tilting said slot plate, at an angle of approximately 90 degrees with respect to a plane of said contactor jig, such that a respective fuzz button slides from a respective slot of the slot plate into each empty jig hole of said row of jig holes;

and wherein a defectively shaped fuzz button is trapped within a slot of the slot plate such that said defectively shaped fuzz button does not slide into any jig hole of said contactor jig;

C. repeating said step B for each of said at least one row of said predetermined number of jig holes on said contactor jig;

D. properly aligning said contactor jig with said fuzz button contactor such that each jig hole on said contact jig faces a respective button hole on said fuzz button contactor, by placing a first dowel guide pin disposed on the fuzz button contactor into a first guide hole disposed on the contactor jig, and placing a second dowel guide pin disposed on the fuzz button contactor into a second guide hole disposed on the contactor jig; and E. pushing a dummy integrated circuit package into said contactor jig after said step D, said dummy integrated circuit package having a respective pin that pushes out the respective fuzz button within each jig hole on said contactor jig into a respective button hole on said fuzz button contactor;

and wherein said fuzz button contactor is used for testing an integrated circuit package with 321 pins that correspond to 321 fuzz buttons placed into 321 button holes on said fuzz button contactor.

* * * * *